(12) United States Patent
Touya et al.

(10) Patent No.: US 8,884,254 B2
(45) Date of Patent: Nov. 11, 2014

(54) CHARGED PARTICLE BEAM WRITING APPARATUS

(71) Applicant: NuFlare Technology, Inc., Yokohama (JP)

(72) Inventors: Takanao Touya, Kanagawa (JP); Munehiro Ogasawara, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/108,936

(22) Filed: Dec. 17, 2013

(65) Prior Publication Data

US 2014/0175303 A1 Jun. 26, 2014

(30) Foreign Application Priority Data

Dec. 26, 2012 (JP) ................. 2012-282715

(51) Int. Cl.
  *H01J 37/28* (2006.01)
  *H01J 37/305* (2006.01)
  *H01J 37/317* (2006.01)
  *H01J 37/302* (2006.01)

(52) U.S. Cl.
  CPC ......... *H01J 37/3177* (2013.01); *H01J 37/3026* (2013.01); *H01J 37/3174* (2013.01)
  USPC ............... 250/492.22; 250/492.2; 250/492.1; 250/396 R; 250/492.23

(58) Field of Classification Search
  CPC ......... H01J 37/09; H01J 37/28; H01J 37/141; H01J 37/145; H01J 37/153; H01J 37/3007; H01J 37/3026; H01J 37/3174; H01J 37/3177; H01J 37/3023; H01J 37/045; H01J 37/21; H01J 37/305; H01J 37/3175; H01J 3/14; H01J 3/26; B82Y 10/00; B82Y 40/00
  See application file for complete search history.

(56) References Cited

U.S. PATENT DOCUMENTS 4,798,953 A * 1/1989 de Chambost ................ 250/310
5,793,041 A    8/1998 Ogasawara et al.
(Continued)

FOREIGN PATENT DOCUMENTS

JP   9-330867 A   12/1997
JP   11-54412 A    2/1999
(Continued)

OTHER PUBLICATIONS

U.S. Appl. No. 14/066,940, filed Oct. 30, 2013, Matsumoto, et al.
(Continued)

*Primary Examiner* — David A Vanore
(74) *Attorney, Agent, or Firm* — Oblon, Spivak, McClelland, Maier & Neustadt, L.L.P.

(57) ABSTRACT

A multi charged particle beam writing apparatus includes a stage to mount a target object thereon, an emission unit to emit a charged particle beam, an aperture member, in which a plurality of openings are formed, to form a multibeam by letting a region including a whole of the plurality of openings be irradiated with the charged particle beam and letting portions of the charged particle beam respectively pass through a corresponding opening of the plurality of openings, a plurality of electromagnetic lenses, directions of whose magnetic fields are opposite, and three or more electrostatic lenses, at least one of which is arranged in each of the magnetic fields of a plurality of electromagnetic lenses and one or more of which also serve as deflectors for collectively deflecting the multibeam onto the target object.

9 Claims, 15 Drawing Sheets

(56) References Cited

U.S. PATENT DOCUMENTS

| | | | |
|---|---|---|---|
| 5,834,783 A * | 11/1998 | Muraki et al. | 250/398 |
| 5,864,142 A | 1/1999 | Muraki et al. | |
| 5,952,667 A * | 9/1999 | Shimizu | 250/492.2 |
| 5,973,332 A * | 10/1999 | Muraki et al. | 250/492.2 |
| 6,011,268 A | 1/2000 | Nakasuji | |
| 6,137,111 A * | 10/2000 | Yamada et al. | 250/492.2 |
| 6,166,387 A * | 12/2000 | Muraki et al. | 250/492.2 |
| 6,429,441 B1 * | 8/2002 | Nakasuji | 250/492.2 |
| 6,555,824 B1 * | 4/2003 | Feuerbaum et al. | 250/396 R |
| 6,642,675 B2 * | 11/2003 | Ogasawara | 315/370 |
| 6,661,008 B2 * | 12/2003 | Takagi et al. | 850/9 |
| 7,041,988 B2 * | 5/2006 | Hamaguchi et al. | 250/492.2 |
| 7,531,799 B2 * | 5/2009 | Kawasaki et al. | 250/311 |
| 7,560,713 B2 * | 7/2009 | Doering et al. | 250/492.22 |
| 8,067,753 B2 | 11/2011 | Touya | |
| 8,148,698 B2 * | 4/2012 | Nishiyama | 250/396 R |
| 8,294,095 B2 * | 10/2012 | Chen et al. | 250/310 |
| 8,319,192 B2 * | 11/2012 | Ren | 250/396 R |
| 8,362,427 B2 | 1/2013 | Nishimura et al. | |
| 8,445,862 B2 * | 5/2013 | Chen et al. | 250/396 ML |
| 8,492,732 B2 * | 7/2013 | Ogasawara | 250/396 R |
| 8,586,951 B2 * | 11/2013 | Yoshikawa et al. | 250/492.22 |
| 8,610,096 B2 | 12/2013 | Touya | |
| 2008/0265174 A1 * | 10/2008 | Hiramoto et al. | 250/398 |
| 2012/0049064 A1 * | 3/2012 | Ren | 250/310 |
| 2012/0145917 A1 * | 6/2012 | Chen et al. | 250/398 |
| 2013/0056647 A1 | 3/2013 | Yoshikawa et al. | |
| 2013/0157198 A1 | 6/2013 | Yoshikawa et al. | |
| 2013/0214172 A1 * | 8/2013 | Touya et al. | 250/396 R |
| 2013/0216953 A1 | 8/2013 | Touya et al. | |
| 2013/0240750 A1 * | 9/2013 | Touya et al. | 250/396 R |
| 2013/0320230 A1 | 12/2013 | Yoshikawa et al. | |
| 2014/0021366 A1 * | 1/2014 | Dohi et al. | 250/396 R |
| 2014/0061499 A1 * | 3/2014 | Ogasawara et al. | 250/400 |

FOREIGN PATENT DOCUMENTS

| | | |
|---|---|---|
| JP | 2003-332207 A | 11/2003 |
| JP | 2006-261342 A | 9/2006 |
| JP | 2007-534121 A | 11/2007 |
| JP | 2014-49545 A | 3/2014 |

OTHER PUBLICATIONS

U.S. Appl. No. 14/108,844, filed Dec. 17, 2013 Touya, et al.
U.S. Appl. No. 14/155,604, filed Jan. 15, 2014, Nakayama, et al.

* cited by examiner a: $V_1 + V_0 + V_2$
b: $(\sqrt{2}-1)V_1 + V_0 - V_2$
c: $-(\sqrt{2}-1)V_1 + V_0 - V_2$
d: $-V_1 + V_0 + V_2$
e: $-V_1 + V_0 + V_2$
f: $-(\sqrt{2}-1)V_1 + V_0 - V_2$
g: $(\sqrt{2}-1)V_1 + V_0 - V_2$
h: $V_1 + V_0 + V_2$

CHARGED PARTICLE BEAM WRITING APPARATUS

CROSS-REFERENCE TO RELATED APPLICATION

This application is based upon and claims the benefit of priority from the prior Japanese Patent Application No. 2012-282715 filed on Dec. 26, 2012 in Japan, the entire contents of which are incorporated herein by reference.

BACKGROUND OF THE INVENTION

1. Field of the Invention

The present invention relates to a multi charged particle beam writing apparatus, and more specifically, for example, relates to a method of writing a pattern on a target object on the stage by radiating multiple beams (multibeams).

2. Description of Related Art

The lithography technique that advances microminiaturization of semiconductor devices is extremely important as being a unique process whereby patterns are formed in the semiconductor manufacturing. In recent years, with high in Legration of LSI, the line width (critical dimension) required for semiconductor device circuits is decreasing year by year. The electron beam (EB) writing technique, which intrinsically has excellent resolution, is used for writing or "drawing" a pattern on a wafer and the like with an electron beam.

As an example employing the electron beam writing technique, a writing apparatus using multiple beams (multibeams) can be cited. Compared with the case of writing a pattern by using an electron beam, since it is possible to emit multiple beams at a time in multiple writing, the throughput can be greatly increased. In the writing apparatus employing a multibeam system, for example, multiple beams are formed by letting an electron beam emitted from an electron gun assembly pass through a mask with a plurality of holes, blanking control is performed for each of the beams, and each unblocked beam irradiates a desired position on a target object or "sample" (refer to, e.g., Japanese Patent Application Laid-open (JP-A) No. 2006-261342).

In an electron beam writing apparatus, each beam shot is focused on a target object surface by an objective lens, and then focus correction (dynamic focusing) is dynamically performed during writing in order to deal with convex and concave of the target object surface by using an electrostatic lens, for example. However, when dynamic focusing is performed, a rotation change occurs in a beam image on the target object surface, and moreover, a magnification change also occurs. Such problems degrade the accuracy of writing position. In the case of a single beam system, since the number of beams is one, a rotation change and a magnification change will occur with respect to one shot, thereby producing a positional error that is not so large in many cases. However, in the case of a multibeam system, as being different from the single beam system, since the number of beams of one shot which are simultaneously irradiating is a large number, if a rotation change and a magnification change occur in the entire multiple beams, a writing positional error may be an unallowable one. Therefore, it is required to reduce as much as possible the rotation change and magnification change of an image due to dynamic focusing. However, when performing such correction using many optical instruments, there occurs a problem that the installation space in the electron lens barrel becomes insufficient.

BRIEF SUMMARY OF THE INVENTION

In accordance with one aspect of the present invention, a multi charged particle beam writing apparatus includes a stage configured to mount a target object thereon, an emission unit configured to emit a charged particle beam, an aperture member, in which a plurality of openings are formed, configured to form a multibeam by letting a region including a whole of the plurality of openings be irradiated with the charged particle beam and letting portions of the charged particle beam respectively pass through a corresponding opening of the plurality of openings, a plurality of electromagnetic lenses, directions of whose magnetic fields are opposite, and three or more electrostatic lenses, at least one of which is arranged in each of the magnetic fields of the plurality of electromagnetic lenses and one or more of which also serve as deflectors for collectively deflecting the multibeam onto the target object.

DETAILED DESCRIPTION OF THE INVENTION

In the following Embodiment, there will be described a configuration in which an electron beam is used as an example of a charged particle beam. However, the charged particle beam is not limited to the electron beam, and other charged particle beam such as an ion beam may also be used.

Moreover, in the following embodiments, there will be described a writing apparatus that can reduce space required for installation of optical instruments, while performing focus correction and suppressing image rotation and magnification change, when writing with multiple beams.

First Embodiment

Figure 1:
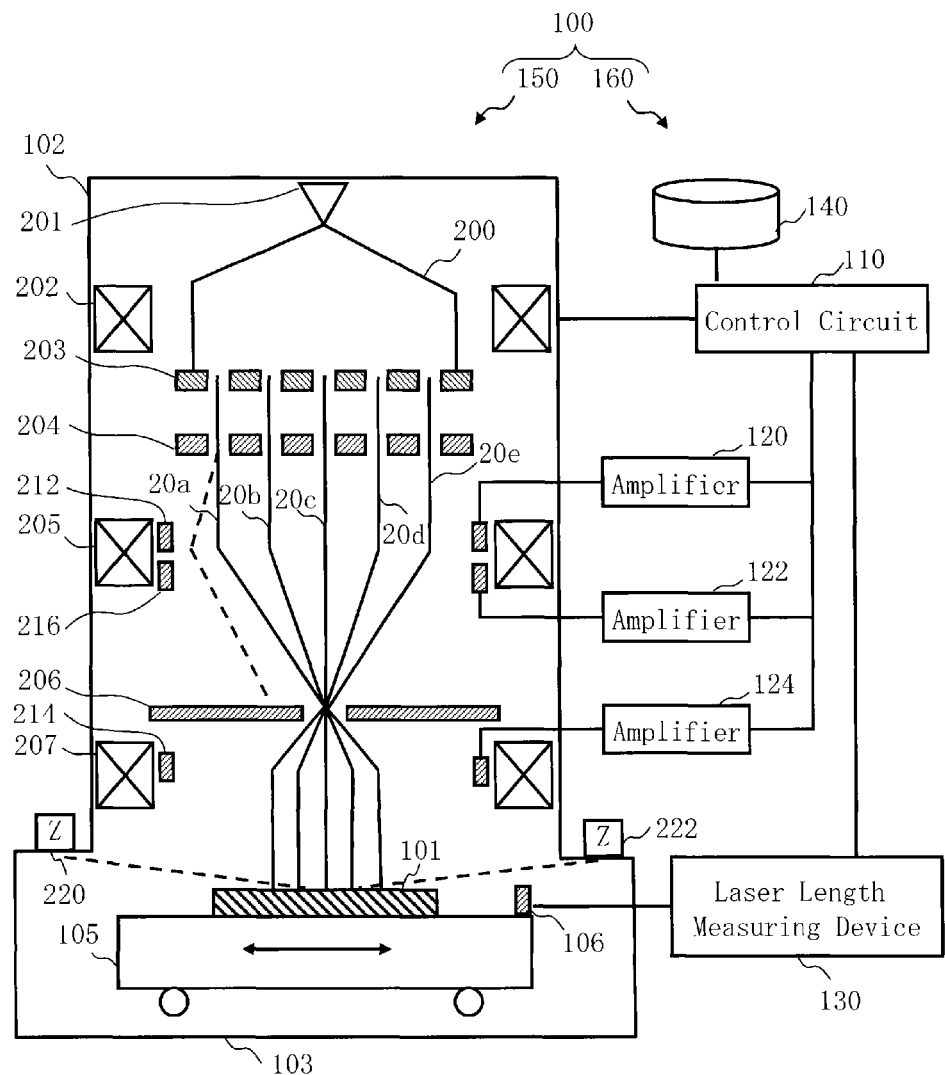
FIG. 1 is a schematic diagram showing the configuration of a writing apparatus according to the first embodiment.

FIG. 1 is a schematic diagram showing the configuration of a writing apparatus according to the first embodiment. In FIG. 1, a writing (or "drawing") apparatus 100 includes a writing unit 150 and a control unit 160. The writing apparatus 100 is an example of a multi charged particle beam writing apparatus. The writing unit 150 includes an electron lens barrel 102 and a writing chamber 103. In the electron lens barrel 102, there are arranged an electron gun assembly 201, an illumination lens 202, an aperture member 203, a blanking plate 204, a reducing lens 205, a limiting aperture member 206, an objective lens 207, and three-stage electrostatic lenses 212, 214, and 216. In the writing chamber 103, there is arranged an XY stage 105, on which a target object or "sample" 101 such as a mask serving as a writing target substrate is placed when performing writing. The target object 101 is, for example, an exposure mask used for manufacturing semiconductor devices, or a semiconductor substrate (silicon wafer) on which semiconductor elements are formed. The target object 101 may be, for example, a mask blank on which resist is applied and a pattern has not yet been formed. A mirror 106 for measuring a laser length is arranged on the XY stage 105. A Z-sensor for measuring a height position (z direction position) of the surface of the target object 101 is arranged on the writing chamber 103 or at the upper part of the writing chamber 103. The Z-sensor includes a projector 220 for emitting laser beams onto the surface of the target object 101 and an optical receiver 222 for receiving lights reflected from the target object 101.

Both the reducing lens 205 and the objective lens 207 are electromagnetic lenses, and arranged such that directions of the magnetic fields are opposite to each other and excitation volumes are equal. The electrostatic lenses 212 and 216 are arranged in the magnetic field of the reducing lens 205. The electrostatic lens 214 is arranged in the magnetic field of the objective lens 207. It is preferable for the electrostatic lenses 212 and 216 to be arranged at the positions completely included in the magnetic field of the reducing lens 205 in order to enlarge the range of focus correction of the electrostatic lens. Similarly, it is preferable for the electrostatic lens 214 to be arranged at the position completely included in the magnetic field of the objective lens 207 in order to make the electrostatic lens 214 efficiently act on the magnetic field of the objective lens 207.

The control unit 160 includes a control circuit 110, amplifiers 120, 122 and 124, a storage device 140, such as a magnetic disk drive, and a laser length measuring device 130. The control circuit 110, the amplifiers 120, 122 and 124, the storage device 140, and the laser length measuring device 130 are connected with each other through the bus (not shown).

FIG. 1 shows a structure necessary for explaining the first embodiment. Other structure elements generally necessary for the writing apparatus 100 may also be included. Although FIG. 1 shows the case where the two electrostatic lenses 212 and 216 are arranged at the side of the reducing lens 205 and one electrostatic lens 214 is arranged at the side of the objective lens 207, it is not limited thereto. That is, one electrostatic lens may be arranged at the side of the reducing lens 205 and two electrostatic lenses may be arranged at the side of the objective lens 207. Moreover, although the three electrostatic lenses are arranged in this case, it is not limited thereto. With regard to the number of electrostatic lenses, at least three or more electrostatic lenses should be in the magnetic fields of the reducing lens 205 and the objective lens 207. If at least three electrostatic lenses are used, it is possible to perform focus correction and suppress image rotation and magnification change. As long as at least three or more electrostatic lenses are used in total, it is acceptable that there is one electrostatic lens in the magnetic field of the electromagnetic lens of the reducing lens 205 or the objective lens 207. How to separate the number of electrostatic lenses used for the reducing lens 205 and the objective lens 207 is not limited as long as at least one or more electrostatic lenses are arranged at each lens side. Moreover, although the magnification of the reducing lens 205 and the objective lens 207 is set to be n:1 being different from each other in FIG. 1, the magnification may be 1:1 as well as n:1 (n>1 and n may be an integer or may not be an integer) as long as they are a group of electromagnetic lenses whose excitation volumes are equal and magnetic field directions are opposite to each other.

Figure 2A:
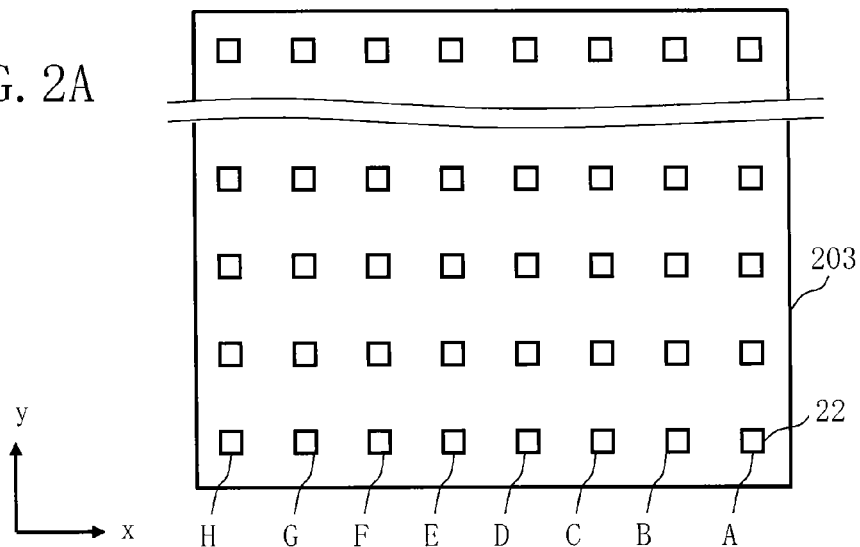
FIGS. 2A and 2B are conceptual diagrams each showing the configuration of an aperture member according to the first embodiment.
Figure 2B:
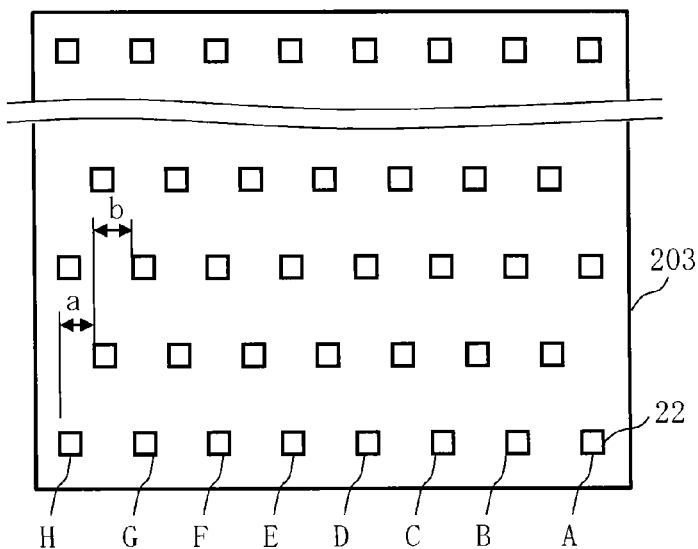

FIGS. 2A and 2B are conceptual diagrams each showing an example of the configuration of an aperture member according to the first embodiment. In FIG. 2A, holes (openings) 22 are formed at a predetermined arrangement pitch, in the shape of a matrix, in the aperture member 203, wherein m×n (m≥2, n≥2) holes 22 are arranged in m columns in the vertical direction (the y direction) and n rows in the horizontal direction (the x direction). In FIG. 2A, holes 22 of 512 (rows)×8 (columns) are formed, for example. The holes 22 are quadrangles of the same dimensions and shape. Alternatively, the holes may be circles of the same circumference. In this case, there is shown an example of each row having eight holes 22 from A to H in the x direction. Multibeams 20 are formed by letting portions of an electron beam 200 respectively pass through a corresponding hole of a plurality of holes 22. Here, there is shown the case where the holes 22 are arranged in a plurality of columns and rows in both the x and the y directions, but it is not limited thereto. For example, it is also acceptable to arrange a plurality of holes 22 in only one row or in only one column, that is, in one row where a plurality of holes are arranged as columns, or in one column where a plurality of holes are arranged as rows. Moreover, the method of arranging the holes 22 is not limited to the case of FIG. 2A where the holes are aligned in a grid. It is also preferable to arrange the holes 22 as shown in FIG. 2B where the position of each hole in the second row is shifted from the position of each hole in the first row by a dimension "a" in the horizontal direction (x direction), for example. Similarly, it is also preferable to arrange the holes 22 such that the position of each hole in the third row is shifted from the position of each hole in the second row by a dimension "b" in the horizontal direction (x direction).

Figure 3:
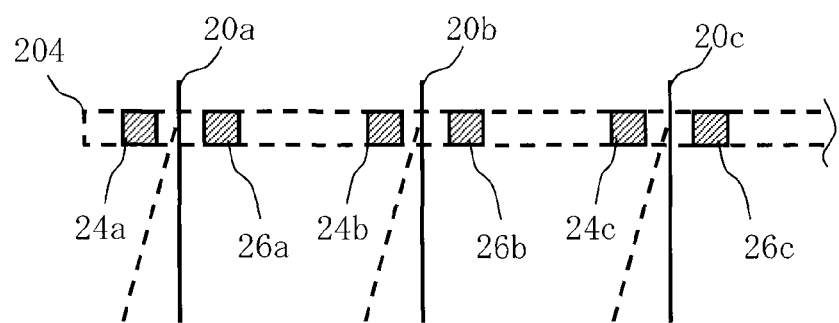
FIG. 3 is a conceptual diagram showing the configuration of a blanking plate according to the first embodiment.

FIG. 3 is a conceptual diagram showing the configuration of a blanking plate according to the first embodiment. In the blanking plate 204, a passage hole is formed to be corresponding to the arrangement position of each hole 22 of the aperture member 203, and a pair of electrodes 24 and 26 (blanker: the first deflector) is arranged for each passage hole. The electron beams 20 (multiple beams) respectively passing through a corresponding passage hole are respectively deflected by the voltage applied to the two electrodes 24 and 26 being a pair, and blanking control is performed by this deflection. Thus, a plurality of blankers respectively perform blanking deflection of a corresponding beam in the multiple beams having passed through a plurality of holes 22 (openings) of the aperture member 203.

The electron beam 200 emitted from the electron gun assembly 201 (emission unit) almost perpendicularly illuminates the whole of the aperture member 203 by the illumination lens 202. A plurality of holes (openings), each being a quadrangle, are formed in the aperture member 203. The region including all the plurality of holes of the aperture member 203 is irradiated with the electron beam 200. For example, a plurality of quadrangular electron beams (multiple beams) 20a to 20e are formed by letting parts of the electron beam 200 pass through a corresponding hole of the plurality of holes of the aperture member 203 respectively. The multiple beams 20a to 20e respectively pass through a corresponding blanker (the first deflector) of the blanking plate 204. Each blanker deflects (performs blanking deflection) each of the electron beam 20 which respectively passes therethrough. The sizes of the multiple beams 20a to 20e having passed through the blanking plate 204 are reduced by the reducing lens 205, and the multiple beams advance toward a hole at the center of the limiting aperture member 206. At this point, the electron beam 20 which was deflected by the blanker of the blanking plate 204 is deviated from the hole at the center of the limiting aperture member 206 (blanking aperture member) and is blocked by the limiting aperture member 206. On the other hand, the electron beam 20 which was not deflected by the blanker of the blanking plate 204 passes through the hole at the center of the limiting aperture member 206. Blanking control is performed by on/off of the blanker so as to control on/off of the beam. Thus, the limiting aperture member 206 blocks each beam which was deflected to be in the "beam off" state by each of a plurality of blankers. Then, beam for one shot of multiple beams is formed by a beam which has been formed during from the "beam on" state to the "beam off" state and has passed through the limiting aperture member 206. The pattern image of the multiple beams 20 having passed through the limiting aperture member 206 is focused by the objective lens 207 and collectively deflected by at least one of the electrostatic lenses 212, 214, and 216, also serving as deflectors, so as to irradiate respective irradiation positions on the target object 101.

The writing apparatus 100 performs a writing operation by the raster scan method, which continuously irradiates shot beams in order while moving the XY stage 105. When writing a desired pattern, a beam necessary in accordance with a pattern is controlled to be "beam on" by blanking control.

Figure 4A:
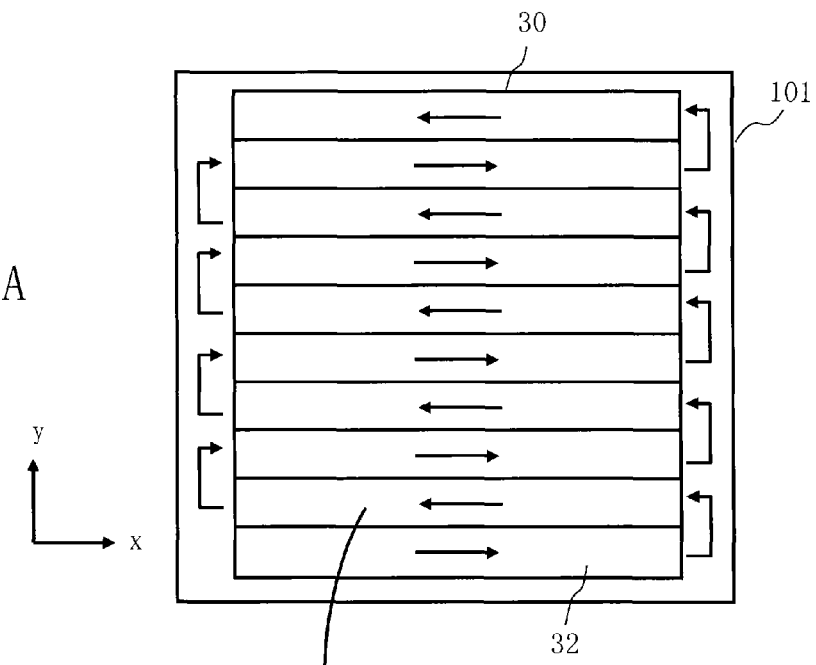
FIGS. 4A to 4C are conceptual diagrams explaining a writing operation according to the first embodiment
Figure 4B:
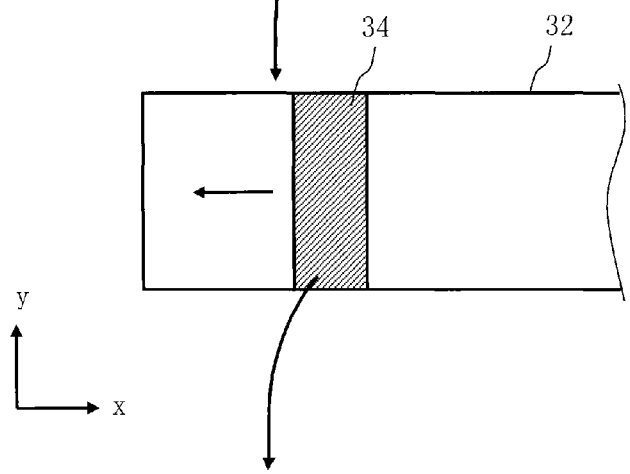
Figure 4C:
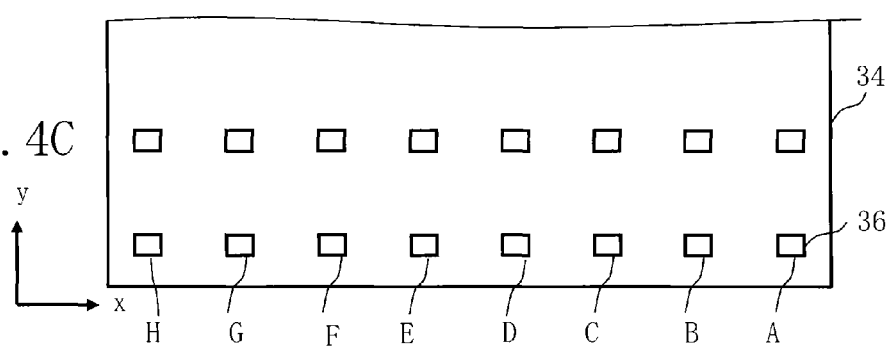

FIGS. 4A to 4C are conceptual diagrams explaining a writing operation according to the first embodiment. As shown in FIG. 4A, a writing region 30 of the target object 101 is virtually divided into a plurality of strip-shaped stripe regions 32 each having a predetermined width in the y direction, for example. Each of the stripe regions 32 serves as a writing unit region. First, the XY stage 105 is moved and adjusted such that an irradiation region 34 to be irradiated with one-time irradiation of the multibeams 20 is located at the left end of the first stripe region 32 or at a position more left than the left end, and then writing is started. When writing the first stripe region 32, the writing advances relatively in the x direction by moving the XY stage 105 in the −x direction, for example. The XY stage 105 is continuously moved at a predetermined speed, for example. After writing the first stripe region 32, the stage position is moved in the −y direction and adjusted such that the irradiation region 34 is located at the right end of the second stripe region 32 or at a position more right than the right end and located to be relatively in the y direction. Then, similarly, as shown in FIG. 4B, writing advances in the −x direction by moving the XY stage 105 in the x direction, for example. That is, writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also acceptable to perform writing in the same direction when writing each stripe region 32. By one shot, as shown in FIG. 4C, a plurality of shot patterns 36 of the same number as the holes 22 are formed at a time by multiple beams which have been formed by passing through respective corresponding holes 22 of the aperture member 203. For example, a beam which passed through one hole A of the aperture member 203 irradiates the position "A" shown in FIG. 4C and forms a shot pattern 36 at this position. Similarly, a beam which passed through one hole B of the aperture member 203 irradiates the position "B" shown in FIG. 4C and forms another shot pattern 36 at this position, for example. Hereafter, a similar operation is performed with respect to C to H. Moving the XY stage 105 in the x direction, the writing apparatus 100 performs writing of each stripe 32 by the raster scan method that continuously irradiates shot beams in order while collectively deflecting all the beams (multiple beams) by at least one of the electrostatic lenses 212, 214, and 216 each of which also has a function as a deflector.

While making the XY stage 105 move continuously or move in a step and repeat manner, the writing apparatus 100 writes a pattern on the target object 101 placed on the XY stage 105.

Figure 5:
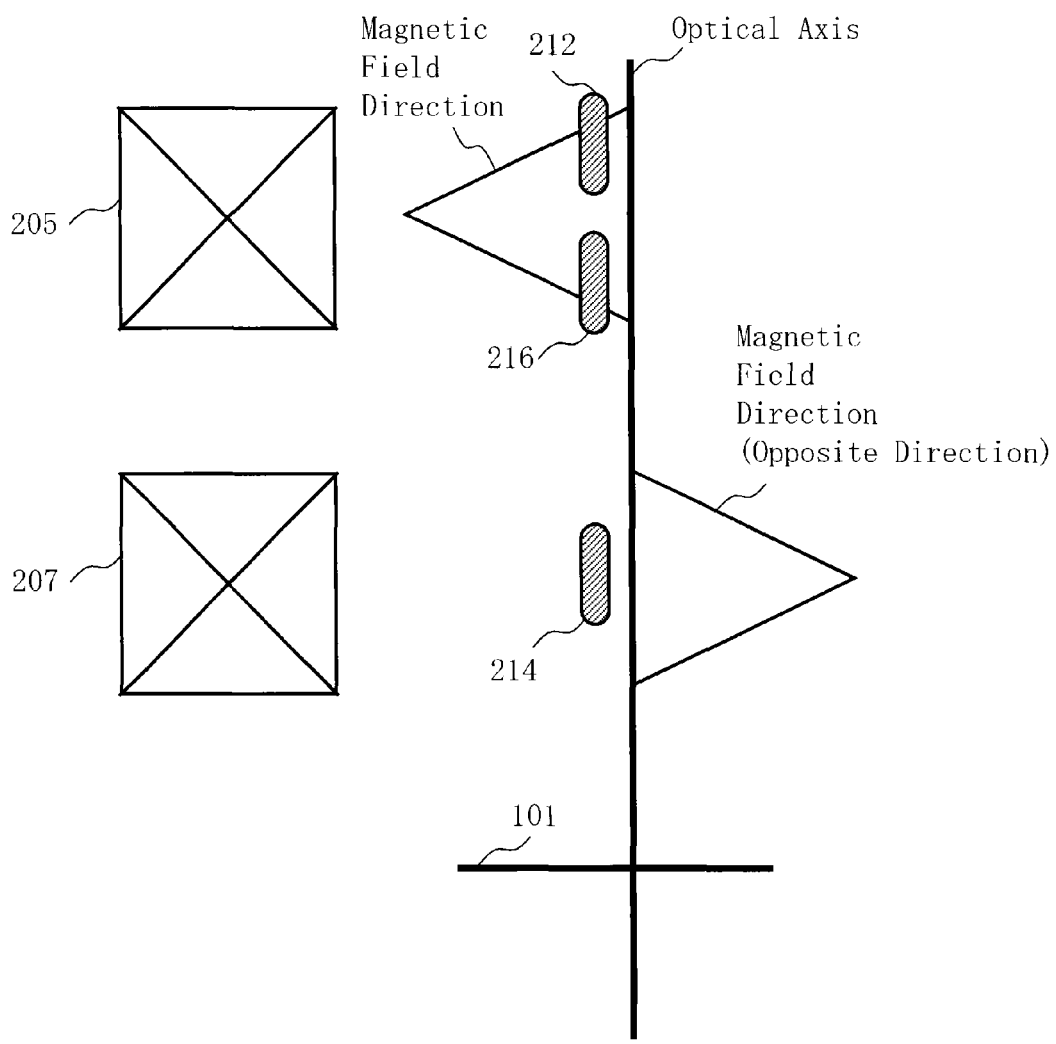
FIG. 5 shows an example of an arrangement position of an electromagnetic lens and an electrostatic lens according to the first embodiment.

FIG. 5 shows an example of an arrangement position of an electromagnetic lens and an electrostatic lens according to the first embodiment. As shown in FIG. 5, both the reducing lens 205 and the objective lens 207 are electromagnetic lenses, and arranged such that directions of their magnetic fields are opposite to each other. The two-stage electrostatic lenses 212 and 216 are arranged in the magnetic field of the reducing lens 205. One-stage electrostatic lens 214 is arranged in the magnetic field of the objective lens 207. At least two-stage electrostatic lenses should be arranged in one magnetic field of a plurality of electromagnetic lenses whose magnetic field directions are opposite to each other, and at least one-stage electrostatic lens should be arranged in another magnetic field. It is also acceptable that the one-stage electrostatic lens is arranged at the side of the reducing lens 205, and the two-stage electrostatic lenses are arranged at the side of the objective lens 207.

When applying a voltage to an electrostatic lens, the focus position of an electron beam changes, a beam image of the electron beam rotates, and magnification of the beam image of the electron beam changes. According to the first embodiment, correcting the focus position and controlling the rotation and the magnification of the beam image are performed simultaneously by using three-stage electrostatic lenses.

Figure 6:
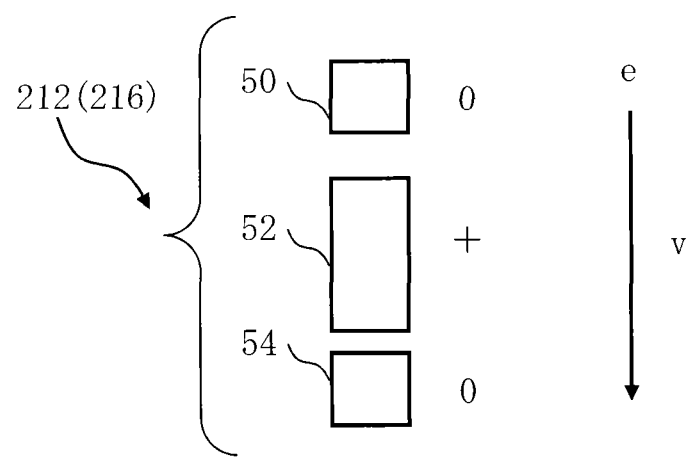
FIG. 6 shows a configuration of an example of an electrostatic lens according to the first embodiment.

FIG. 6 shows a configuration of an example of an electrostatic lens according to the first embodiment. For example, each of the electrostatic lenses 212 and 216 is composed of ring-shaped three-stage electrodes 50, 52, and 54. The focus of the multibeams 20 can be adjusted by applying 0 V to the upper and lower electrodes 50 and 54 and a positive voltage to the middle electrode 52. As for electrons passing through these electrostatic lenses 212 and 216, the speed v changes in accordance with the voltage variation. A rotation amount θ of an image is proportional to a value obtained by integrating another value, which is calculated by dividing the magnetic field B by a transfer rate v of an electron, by the transfer rate v.

$$\theta = \tfrac{1}{2} \cdot e/m \cdot \smallint (B/v \cdot dv)$$

e: electric charge
m: electron mass
B: magnetic field
v: rate

Therefore, the electrostatic lenses 212 and 216 can adjust the rotation amount θ of an image. Thus, it is possible to rotate, while focusing, a beam image by adjusting the voltage to be applied to the electrostatic lenses 212 and 216. Moreover, the electrostatic lenses 212 and 216 can change the magnification of a beam image. The two electrostatic lenses 212 and 216 can perform two operations of focus correction, beam image rotation control, and beam image magnification control. For simultaneously controlling the three operations, three electrostatic lenses 212, 214 and 216 are needed.

When a digital signal is output to the amplifier 120 from the control circuit 110, the amplifier 120 converts the signal to analog and amplifies the analog signal to be applied as a deflection voltage to the electrostatic lens 212. In this case, the deflection voltage is applied to the electrode 52 being the second stage of the electrostatic lens 212. A voltage of 0 V should be applied in advance to the upper and lower electrodes 50 and 54 of the electrostatic lens 212 from an amplifier, etc. (not shown). Similarly, when a digital signal is output to the amplifier 122 from the control circuit 110, the amplifier 122 converts the signal to analog and amplifies the analog signal to be applied as a deflection voltage to the electrostatic lens 216. In this case, the deflection voltage is applied to the electrode 52 being the second stage of the electrostatic lens 216. A voltage of 0 V should be applied in advance to the upper and lower electrodes 50 and 54 of the electrostatic lens 216 from an amplifier, etc. (not shown).

Figure 7:
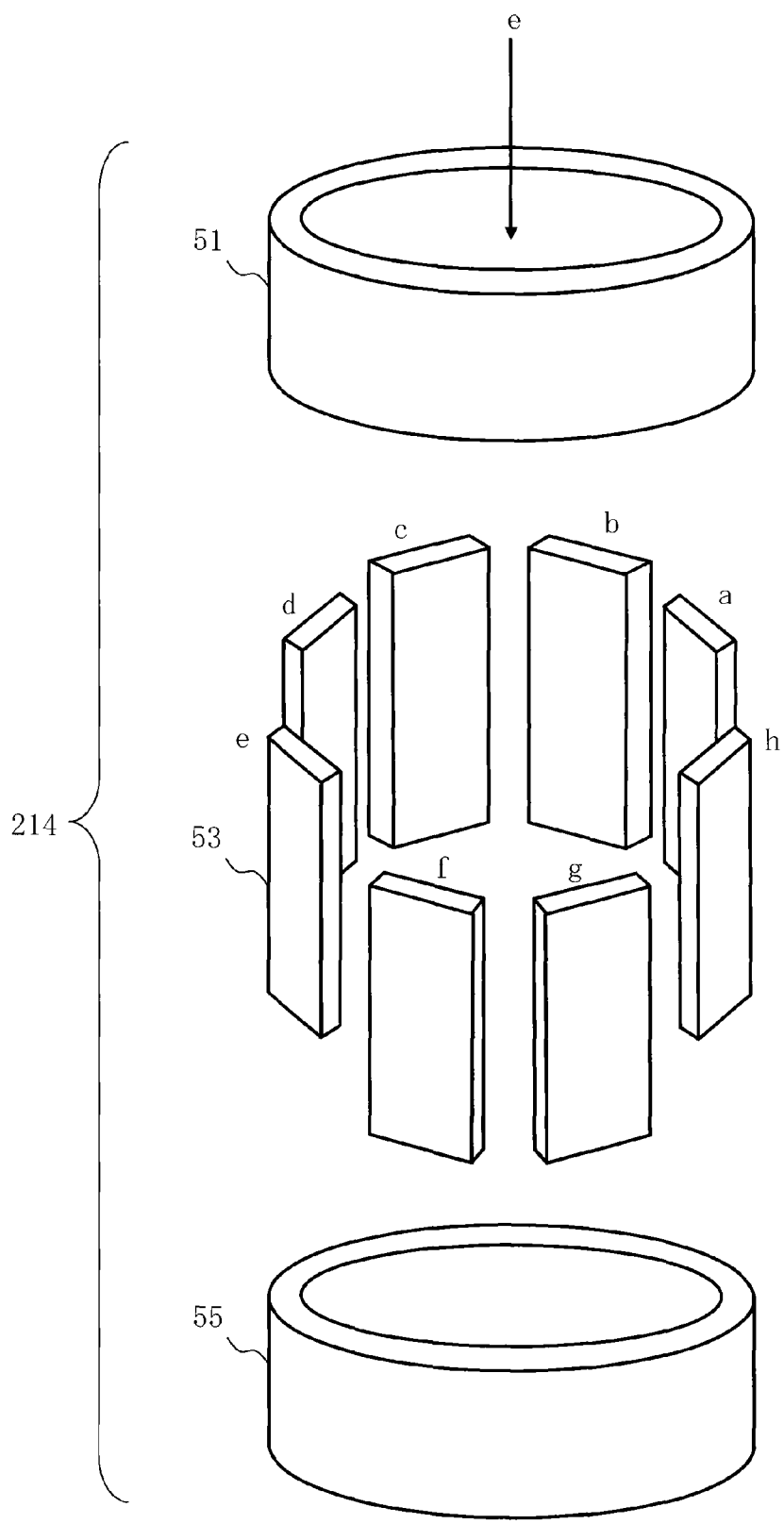
FIG. 7 shows a configuration of another example of the electrostatic lens according to the first embodiment.

FIG. 7 shows a configuration of another example of the electrostatic lens according to the first embodiment. For example, the electrostatic lens 214 is composed of a ring-shaped electrode 51, being the first stage, a plurality of electrodes 53 (53a to 53h) separated along the direction of the circumference, being the second stage, and a ring-shaped electrode 55, being the third stage. The electrostatic lens 214 also serves as a deflector that collectively deflects multiple beams. Therefore, the electrostatic lens 214 is separated into a plurality of electrodes 53, each having the same shape, in order to deflect beams towards desired directions. When using it as the electrostatic lens, one of the focus of the multibeams 20, the rotation of an image, and the magnification of the image can be adjusted by applying a voltage of 0 V to the upper and lower electrodes 51 and 55 and equal positive voltages to a plurality of electrodes 53 of the middle stage.

When a digital signal is output to the amplifier 124 from the control circuit 110, the amplifier 124 converts the signal to analog and amplifies the analog signal to be applied as a deflection voltage to the electrostatic lens 214. In this case, the deflection voltage is applied to the electrode 53 being the second stage of the electrostatic lens 214. A voltage of 0 V should be applied in advance to the upper and lower electrodes 51 and 55 of the electrostatic lens 214 from an amplifier, etc. (not shown).

As described above, according to the first embodiment, one or more of the three or more electrostatic lenses 212, 214 and 216 serve as deflectors for collectively deflecting multiple beams to the target object 101. Therefore, it is not necessary to separately provide a deflector. Thus, the installation space for a deflector separately provided can be made unnecessary. In particular, in the electron lens barrel 102, it becomes unnecessary to further arrange a deflector in a height-wise direction in addition to three or more electrostatic lenses. The electrostatic lens 214 which also serves as a deflector has a sufficient length to deflect multiple beams to the target object 101. Voltage corresponding to the amount of focus correction for dynamically focusing by the electrostatic lens 214 is equally applied to a plurality of electrodes 53 of the electrostatic lens 214.

Figure 8:
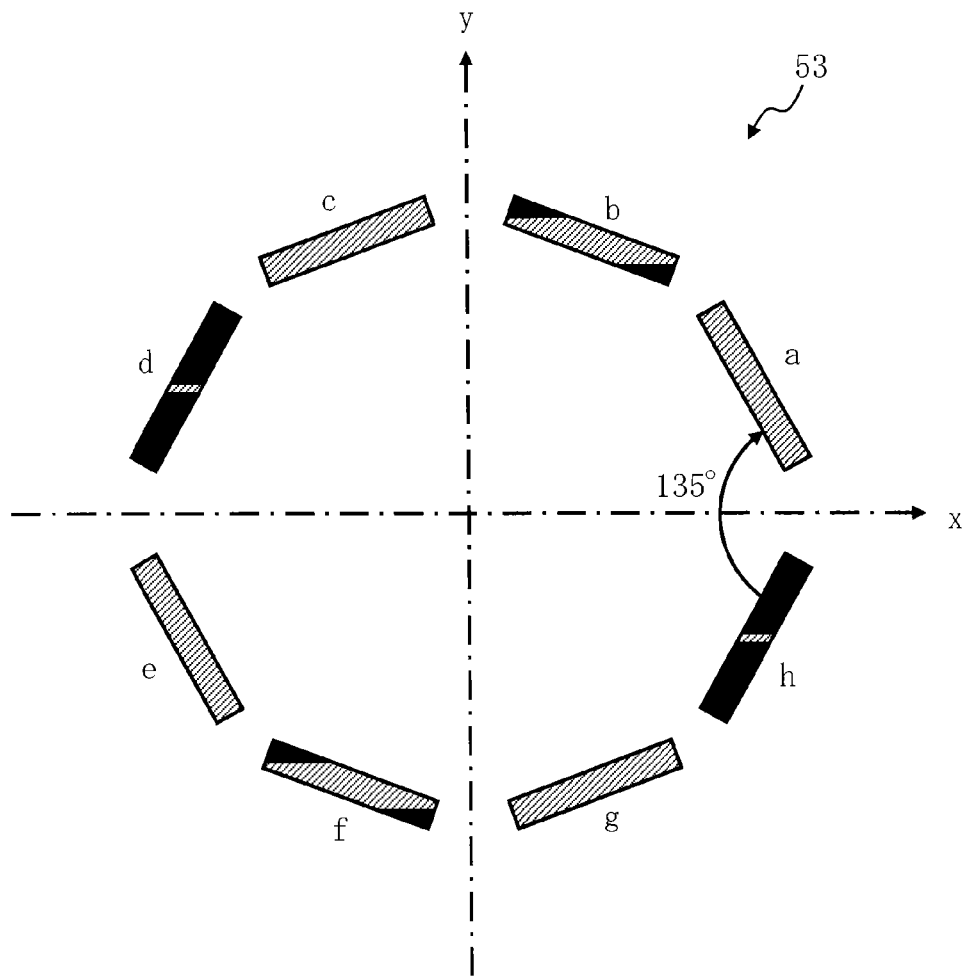
FIG. 8 is a top view showing an example of an electrostatic lens which also serves as a deflector according to the first embodiment.

FIG. 8 is a top view showing an example of an electrostatic lens which also serves as a deflector according to the first embodiment. FIG. 8 shows the state viewed from above a plurality of electrodes 53 being the second stage. For example, the electrodes 53 are arranged in the direction of the circumference, shifted from each other by the angle of 135°, for example. When deflecting multiple beams in the x direction, the following voltage is applied to each electrode 53. A voltage $V_1$ for the function as a deflector and a voltage $V_0$ for the function as an electrostatic lens are applied in parallel to an electrode 53a. That is, a voltage of $V_1+V_0$ is applied to the electrode 53a. A voltage $(\sqrt{2}-1)V_1$ for the function as a deflector and a voltage $V_0$ for the function as an electrostatic lens are applied in parallel to an electrode 53b. That is, a voltage of $(\sqrt{2}-1)V_1+V_0$ is applied to the electrode 53b. A negative voltage $-(\sqrt{2}-1)V_1$ for the function as a deflector and a voltage $V_0$ for the function as an electrostatic lens are applied in parallel to an electrode 53c. That is, a voltage of $-(\sqrt{2}-1)V_1+V_0$ is applied to the electrode 53c. A negative voltage $-V_1$ for the function as a deflector and a voltage $V_0$ for the function as an electrostatic lens are applied in parallel to an electrode 53d. That is, a voltage of $-V_1+V_0$ is applied to the electrode 53d. A negative voltage $-V_1$ for the function as a deflector and a voltage $V_0$ for the function as an electrostatic lens are applied in parallel to an electrode 53e. That is, a voltage of $-V_1+V_0$ is applied to the electrode 53e. A negative voltage $-(\sqrt{2}-1)V_1$ for the function as a deflector and a voltage $V_0$ for the function as an electrostatic lens are applied in parallel to an electrode 53f. That is, a voltage of $-(\sqrt{2}-1)V_1+V_0$ is applied to the electrode 53f. A voltage $(\sqrt{2}-1)V_1$ for the function as a deflector and a voltage $V_0$ for the function as an electrostatic lens are applied in parallel to an electrode 53g. That is, a voltage of $(\sqrt{2}-1)V_1+V_0$ is applied to the electrode 53g. A voltage $V_1$ for the function as a deflector and a voltage $V_0$ for the function as an electrostatic lens are applied in parallel to an electrode 53h. That is, a voltage of $V_1+V_0$ is applied to the electrode 53h. Voltage necessary for the deflectors should be respectively applied from amplifiers (not shown) each of which is prepared for each electrode 53. It is preferable for each of the amplifiers for the deflectors to be connected in parallel with the amplifier 124 with respect to the corresponding electrode 53.

Further, it is more preferable for the electrostatic lens 214, which also serves as a deflector, to also have a function as a stigmator. In the case of having this function, it is unnecessary to separately provide a stigmator. Therefore, the installation space for a stigmator can be made unnecessary. In particular, in the electron lens barrel 102, it becomes unnecessary to further arrange a stigmator in a height-wise direction in addition to the three or more electrostatic lenses. In such a case, a voltage $V_2$ for astigmatism correction is further applied to each electrode 53. For example, when applying a positive voltage in the x direction and a negative voltage in the y direction in order to correct astigmatism, the following voltage is applied to each electrode 53. A voltage $V_1$ for the function as a deflector, a voltage $V_0$ for the function as an electrostatic lens, and a voltage $V_2$ for astigmatism correction are applied in parallel to the electrode 53a. That is, a voltage of $V_1+V_0+V_2$ is applied to the electrode 53a. A voltage $(\sqrt{2}-1)V_1$ for the function as a deflector, a voltage $V_0$ for the function as an electrostatic lens, and a negative voltage $-V_2$ for astigmatism correction are applied in parallel to the electrode 53b. That is, a voltage of $(\sqrt{2}-1)V_1+V_0-V_2$ is applied to the electrode 53b. A negative voltage $-(\sqrt{2}-1)V_1$ for the function as a deflector, a voltage $V_0$ for the function as an electrostatic lens, and a negative voltage $-V_2$ for astigmatism correction are applied in parallel to the electrode 53c. That is, a voltage of $-(\sqrt{2}-1)V_1-V_0-V_2$ is applied to the electrode 53c. A negative voltage $-V_1$ for the function as a deflector, a voltage $V_0$ for the function as an electrostatic lens, and a voltage $V_2$ for astigmatism correction are applied in parallel to the electrode 53d. That is, a voltage of $-V_1+V_0+V_2$ is applied to the electrode 53d. A negative voltage $-V_1$ for the function as a deflector, a voltage $V_0$ for the function as an electrostatic lens, and a voltage $V_2$ for astigmatism correction are applied in parallel to the electrode 53e. That is, a voltage of $-V_1+V_0+V_2$ is applied to the electrode 53e. A negative voltage $-(\sqrt{2}-1)V_1$ for the function as a deflector, a voltage $V_0$ for the function as an electrostatic lens, and a negative voltage $-V_2$ for astigmatism correction are applied in parallel to the electrode 53f. That is, a voltage of $-(\sqrt{2}-1)V_1+V_0-V_2$ is applied to the electrode 53f. A voltage $(\sqrt{2}-1)V_1$ for the function as a deflector, a voltage $V_0$ for the function as an electrostatic lens, and a negative voltage $-V_2$ for astigmatism correction are applied in parallel to the electrode 53g. That is, a voltage of $(\sqrt{2}-1)V_1+V_0-V_2$ is applied to the electrode 53g. A voltage $V_1$ for the function as a deflector, a voltage $V_0$ for the function as an electrostatic lens, and a voltage $V_2$ for astigmatism correction are applied in parallel to the electrode 53h. That is, a voltage of $V_1+V_0+V_2$ is applied to the electrode 53h. Voltages necessary for astigmatism correction are respectively applied from amplifiers (not shown) each prepared for each electrode 53. It is preferable for each of the amplifiers for astigmatism correction to be connected in parallel with the amplifier 124 and amplifiers for deflection with respect to a corresponding electrode 53.

Figure 9:
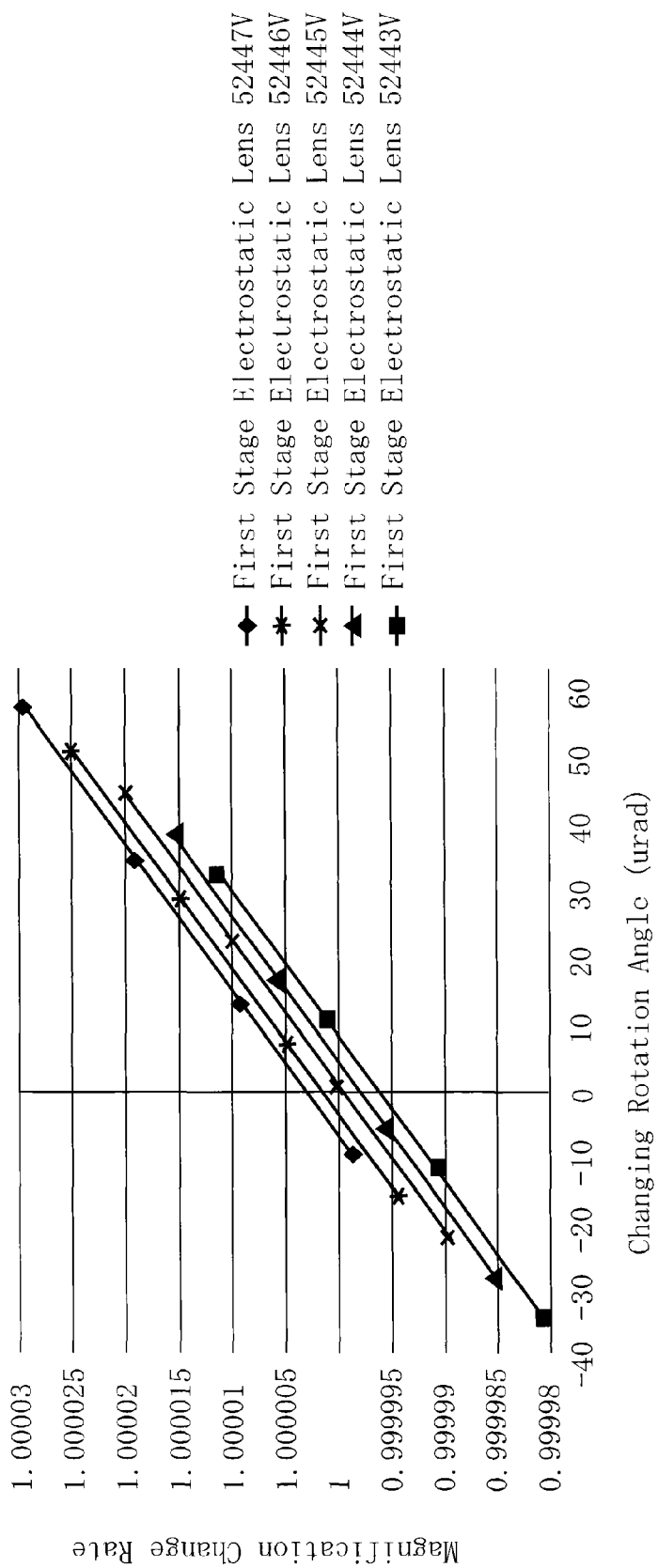
FIG. 9 shows an example of a rotation change and a magnification change of an image at the time of making voltage applied to three electrostatic lenses variable according to the first embodiment.

FIG. 9 shows an example of a rotation change and a magnification change of an image at the time of making voltage applied to the three electrostatic lenses variable according to the first embodiment. FIG. 9 shows an example of a correlation table, in which there is defined correlation among a changing rotation angle of a beam image, a magnification change rate of the beam image, and a group of voltages applied to the three-stage electrostatic lenses, in the case of locking the focus on the focus position and changing a group of voltages to be applied to the three-stage electrostatic lenses 212, 214 and 216, on the assumption that dynamic focusing is not implemented but the focus position is fixed to a position $Z_0$ adjusted with the objective lens 207, for example. FIG. 9 shows a variation of the changing rotation angle and the magnification change rate of a beam image when, after setting the voltage of the first stage electrostatic lens, changing the voltages of the second and third stage electrostatic lenses 214 and 216 so that the focus position may be locked on a position $Z_0$. FIG. 9 also shows the case of respectively changing the voltage of the first stage electrostatic lens. In FIG. 9, after setting the voltage of the first stage electrostatic lens 212 to be 52445 V, each voltage of the second and third stage electrostatic lenses 214 and 216 is set so that the changing rotation angle of a beam image may be a value 0 and the magnification change rate of the beam image may be a value 1 on the graph where the voltage of the first stage electrostatic lens 212 is 52445 V. Although each voltage of the second and third stage electrostatic lenses 214 and 216 is not shown in FIG. 9, there is shown, as correlation data in the correlation table, each voltage of the second and third stage electrostatic lenses 214 and 216 at the time of the changing rotation angle of a beam image being a value 0 and the magnification change rate of the beam image being a value 1 on the graph where the voltage of the first stage electrostatic lens 212 is 52445V. This correlation table is stored in the storage device 140. The correlation needs to be obtained in advance by simulation or experiment in order to generate a correlation table to be stored in the storage device 140.

Figure 10:
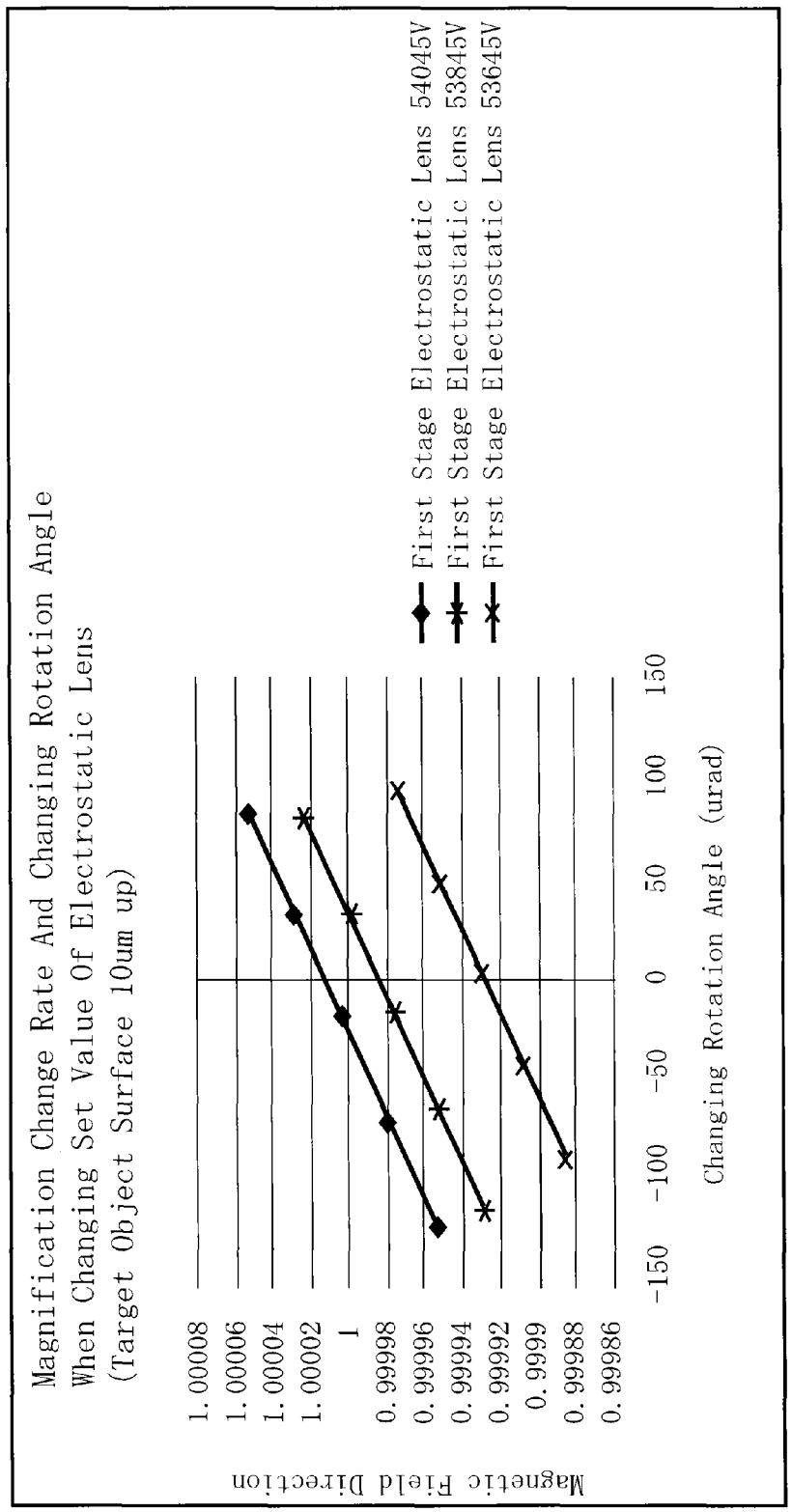
FIG. 10 shows an example of a rotation change and a magnification change of an image at the time of making voltage applied to three electrostatic lenses variable according to the first embodiment.
Figure 11:
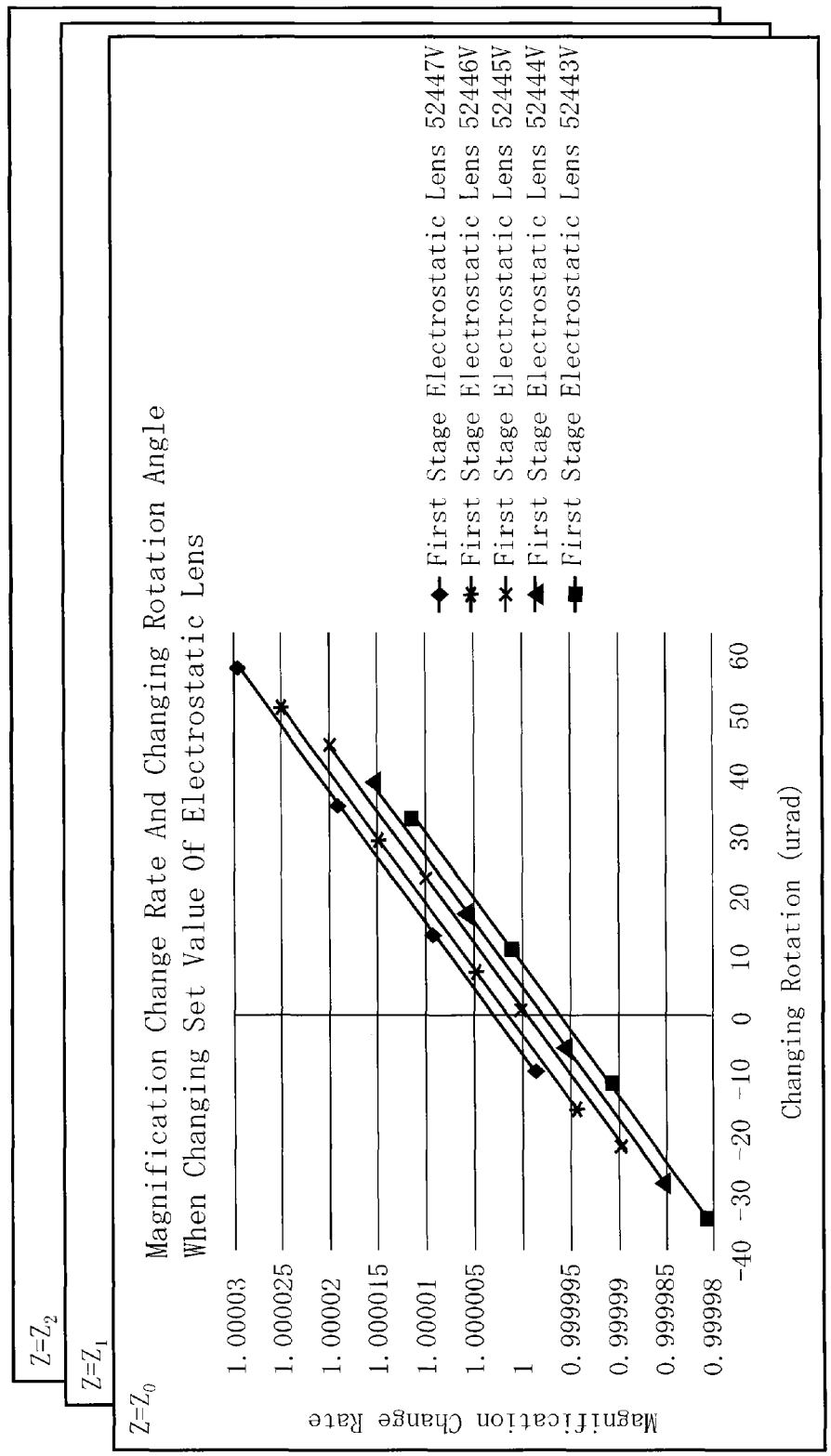
FIG. 11 shows another example of a rotation change and a magnification change of an image at the time of making voltage applied to three electrostatic lenses variable according to the first embodiment.

FIG. 10 shows an example of a rotation change and a magnification change of an image at the time of making voltage applied to the three electrostatic lenses variable according to the first embodiment. FIG. 10 shows an example of a correlation among a changing rotation angle of a beam image, a magnification change rate of the beam image, and a group of voltages applied to the three-stage electrostatic lenses, in the case of changing the focus to a certain focus position, locking the focus on the focus position ($Z=Z_0+10$ μm), and changing a group of voltages to be applied to the three-stage electrostatic lenses, on the assumption that dynamic focusing is implemented with the electrostatic lenses 212, 214, and 216, for example. FIG. 10 shows a variation of the changing rotation angle and the magnification change rate of a beam image when, after setting the voltage of the first stage electrostatic lens, changing the voltages of the second and third stage electrostatic lenses 214 and 216 so that the focus position may be locked on a position $Z_0+10$ μm. FIG. 10 also shows the case of respectively changing the voltage of the first stage electrostatic lens. In FIG. 10, after setting the voltage of the first stage electrostatic lens 212 to be about 53845 V, each voltage of the second and third stage electrostatic lenses 214 and 216 is set so that the changing rotation angle of a beam image may be a value 0 and the magnification change rate of the beam image may be a value 1 on the graph where the voltage of the first stage electrostatic lens 212 is about 53845 V. Although each voltage of the second and third stage electrostatic lenses 214 and 216 is not shown in FIG. 10, there is shown, as correlation data in the correlation table, each voltage of the second and third stage electrostatic lenses 214 and 216 at the time of the changing rotation angle of a beam image being a value 0 and the magnification change rate of the beam image being a value 1 on the graph where the voltage of the first stage electrostatic lens 212 is about 53845 V. Here, the group of voltage is expressed by a group of electron relativistic potential. That is, it is expressed by electric potential of $Vtot(1+\epsilon Vtot)$ which is obtained when a voltage Vs is applied to an electrostatic lens and the energy of electron in the electrostatic lens is changed from $eV0$ to $eVtot=e(V0+Vs)$. Here, e is an elementary charge (to $1.6e^{-19}$ Coulomb), and $\epsilon$ to $0.9785/(MV)$. The case of V0 to 50 kV is shown in this calculation. FIG. 11 shows a similar case.

FIG. 11 shows another example of a rotation change and a magnification change of an image at the time of making voltage applied to the three electrostatic lenses variable according to the first embodiment. FIG. 11 shows an example of a correlation table, in which there is defined correlation among a changing rotation angle of a beam image, a magnification change rate of the beam image, and a group of voltages applied to the three-stage electrostatic lenses, in the case of changing the focus position, locking the focus on each focus position concerned, and changing a group of voltages to be applied to the three-stage electrostatic lenses, on the assumption that dynamic focusing is implemented with the electrostatic lenses 212, 214, and 216, for example. This correlation table is stored in the storage device 140. The correlation needs to be obtained in advance by simulation or experiment in order to generate a correlation table to be stored in the storage device 140. FIG. 11 shows a variation of the changing rotation angle and the magnification change rate of a beam image when, after setting the voltage of the first stage electrostatic lens, changing the voltages of the second and third stage electrostatic lenses 214 and 216 so that each focus position may be a corresponding focus position Z. FIG. 11 also shows the case of respectively changing the voltage of the first stage electrostatic lens. In FIG. 11, for example, in the case of making the focus position be $Z=Z_0$, after setting the voltage of the first stage electrostatic lens 212 to be 52445 V, each voltage of the second and third stage electrostatic lenses 214 and 216 is set so that the changing rotation angle of a beam image may be a value 0 and the magnification change rate of the beam image may be a value 1 on the graph where the voltage of the first stage electrostatic lens 212 is 52445 V. Although each voltage of the second and third stage electrostatic lenses 214 and 216 is not shown in FIG. 11, there is shown, as correlation data in the correlation table, each voltage of the second and third stage electrostatic lenses 214 and 216 at the time of the changing rotation angle of a beam image being a value 0 and the magnification change rate of the beam image being a value 1 on the graph where the voltage of the first stage electrostatic lens 212 is 52445 V.

When the writing apparatus 100 writes a pattern on the target object 101, it operates as follows: First, the surface height of the target object 101 on the XY stage 105 is measured with a Z-sensor. Then, referring to the correlation table stored in the storage device 140, a group of voltages to be applied to the electrostatic lenses 212, 214 and 216 is obtained while dynamically focusing an electron beam in accordance with the measured surface height of the target object 101, maintaining the magnification of a beam image to be constant, and controlling the beam image not to rotate. In other words, adjustment of the electrostatic lenses 212, 214 and 216 is performed such that the multibeam is dynamically focused in accordance with a surface height of the target object, magnification of a beam image of the multibeam is maintained to be constant, and the beam image is not rotated at the same time, by using the electrostatic lenses 212, 214 and 216. It becomes possible to perform adjustment so that the magnification of a beam image may be retained to be constant and the beam image may not rotate, by applying a corresponding voltage in the group to each of the electrostatic lenses 212, 214 and 216, while dynamically focusing multiple beams in accordance with the surface height of the target object.

Figure 12A:
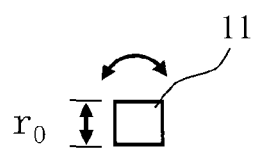
FIGS. 12A and 12B are conceptual diagrams explaining an example of an effect of a three-stage electrostatic lens according to the first embodiment.
Figure 12B:
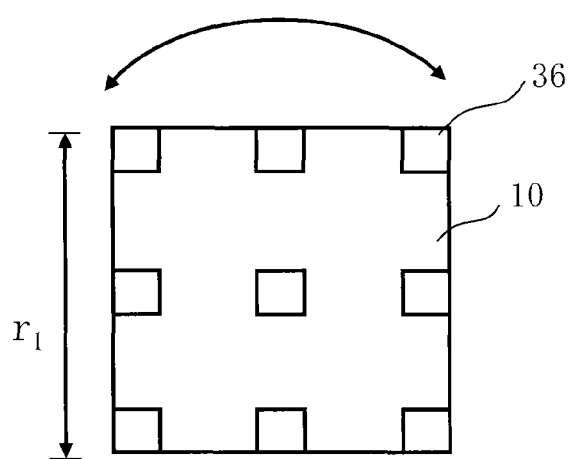

FIGS. 12A and 12B are conceptual diagrams explaining an example of an effect of a three-stage electrostatic lens according to the first embodiment. In the single beam system, as shown in FIG. 12A, since the irradiation region is a shot FIG. 11 formed by one beam shot, a rotation radius $r_0$ is small. Therefore, even when a rotation error of the stage occurs, its positional error is small. On the other hand, in the multibeam system, as shown in FIG. 12B, since multiple shot FIG. 36 are irradiated with a large number of beams of one shot, an irradiation region 10 is large. Therefore, a rotation radius r1 is large in accordance with the irradiation region. Accordingly, if a rotation error of the stage occurs, since the whole of the irradiation region 10 rotates, the positional deviation amount of each shot FIG. 36 is large. Then, according to the first embodiment, it is possible to inhibit such positional deviation by arranging a three-stage electrostatic lens to cancel out a rotation error of the stage. In particular, such an effect is large in the multibeam system.

Figure 13A:
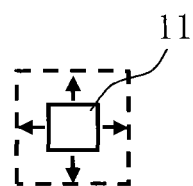
FIGS. 13A and 13B are conceptual diagrams explaining another example of an effect of a three-stage electrostatic lens according to the first embodiment 1.
Figure 13B:
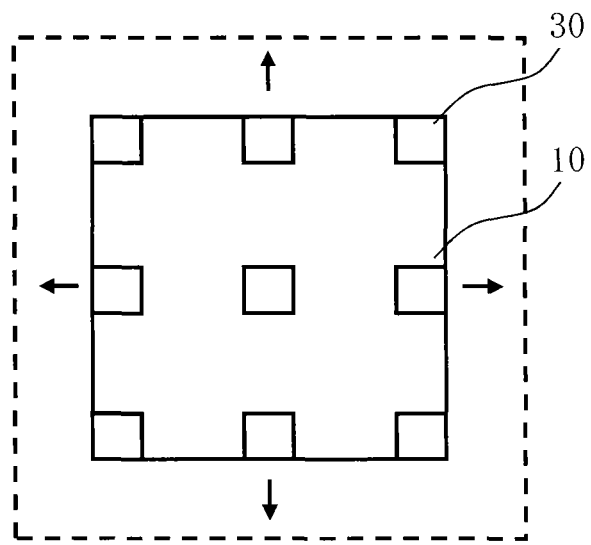

FIGS. 13A and 13B are conceptual diagrams explaining another example of an effect of a three-stage electrostatic lens according to the first embodiment. In the single beam system, as shown in FIG. 13A, since the irradiation region is the shot FIG. 11 formed by one beam shot, even when a magnification change occurs, its positional error is small. On the other hand, in the multibeam system, as shown in FIG. 13B, since the multiple shot FIG. 36 are irradiated with a large number of beams of one shot, the irradiation region 10 is large. Accordingly, if a magnification change occurs, since the magnification of the whole of the irradiation region 10 changes, the positional deviation amount of each shot FIG. 36 is larger in the case where the same magnification change as that of the single beam system occurs. Then, according to the first embodiment 1, it is possible to inhibit such positional deviation by arranging a three-stage electrostatic lens to cancel out a magnification change of an image. In particular, such an effect is large in the multibeam system.

As described above, according to the first embodiment, structure elements can be reduced by integration performed by letting an electrostatic lens to also serve as a deflector and/or a stigmator. Therefore, a space necessary for installation can be reduced. Accordingly, the installation space can be effectively utilized.

As described above, according to the first embodiment, it is possible to reduce a space necessary for installation of an optical instrument while performing focus correction and suppressing rotation and magnification change of an image in multibeam writing.

Second Embodiment

Although the case of collectively deflecting multiple beams by using a single stage deflector is described in the first embodiment, it is not limited thereto. It is also preferable to collectively deflect multiple beams by using a multi-stage deflector of two or more stages. In the second embodiment, there will be described a case of collectively deflecting multiple beams by using a two-stage deflection of, for example, main and sub (auxiliary) deflection. In particular, in the second embodiment, the case of main deflection of two stages will be described.

Figure 14:
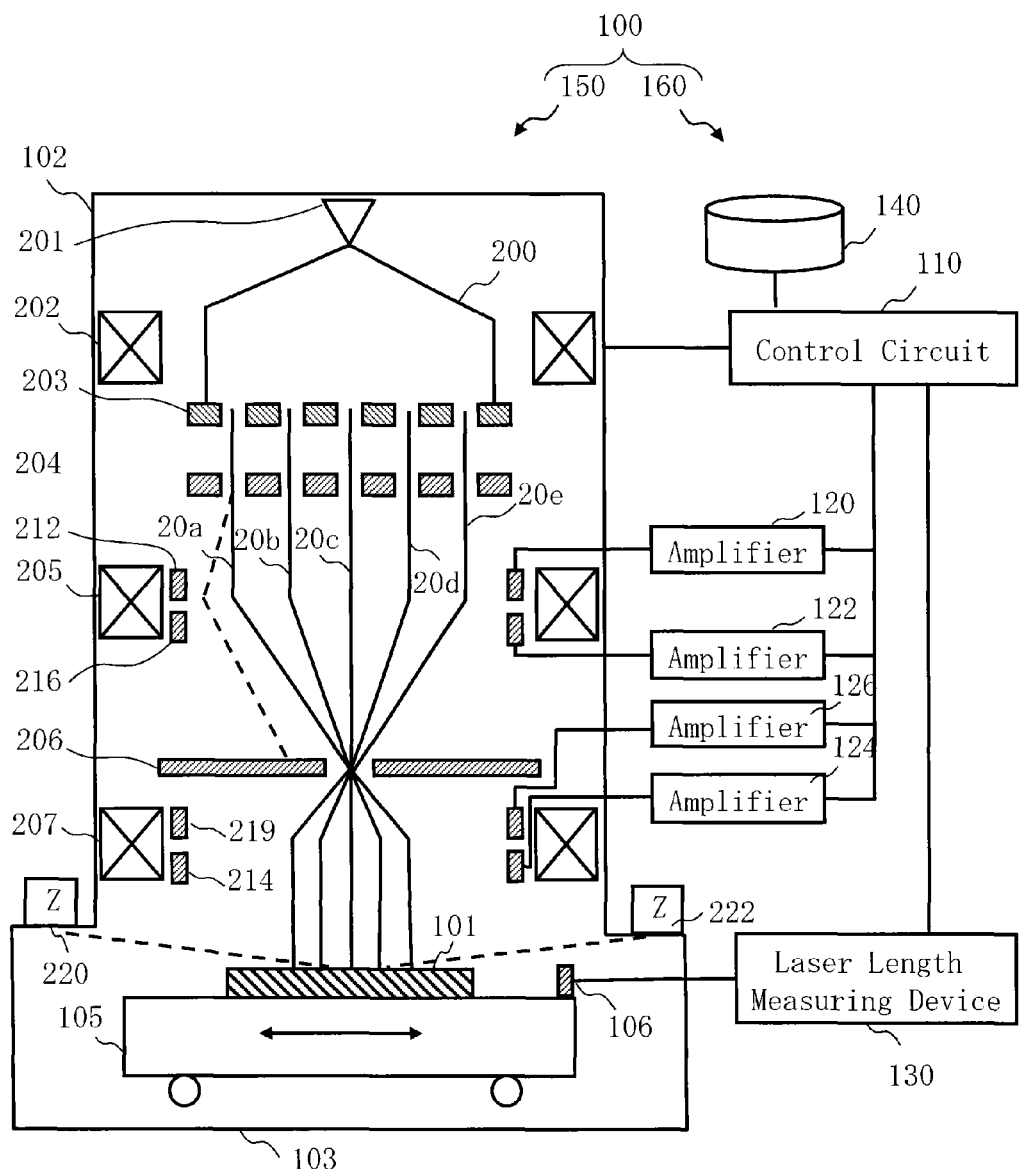
FIG. 14 is a schematic diagram showing the structure of a writing apparatus according to the second embodiment.

FIG. 14 is a schematic diagram showing the structure of a writing apparatus according to the second embodiment. FIG. 14 is the same as FIG. 1 except that a sub deflector 219 and an amplifier 126 are added. In the second embodiment, each of two of the electrostatic lenses 212, 214 and 216 also serves as a main deflector. For example, the electrostatic lens 216 also serves as one of the two main deflectors, and the electrostatic lens 214 also serves as the other of the two main deflectors. It is preferable for the sub deflector 219 to be arranged between the two main deflectors (the electrostatic lenses 216 and 214). A distance for performing reversing deflection of a beam is needed so that multiple beams deflected by the front stage of the two main deflectors may be reverse deflected by the back stage main deflector. Then, by arranging the sub deflector 219 between the two main deflectors, the space between the two main deflectors can be effectively used. The configuration of the two electrostatic lenses 216 and 214 which also serve as the two main deflectors may be the same as that in FIG. 7. The configuration of the electrostatic lens 212 is the same as that in FIG. 6. Coma aberration can be reduced by having two-stage main deflection. With regard to the sub deflector 219, a deflection voltage may be applied from the amplifier 126.

In the case of two-stage deflection of main and sub deflection, a beam is deflected by a main deflector to a reference position in a region deflectable by a sub deflector, and in such a state, writing is performed by respectively deflecting multiple beams to each position in the region by the sub deflector 219.

Figure 15:
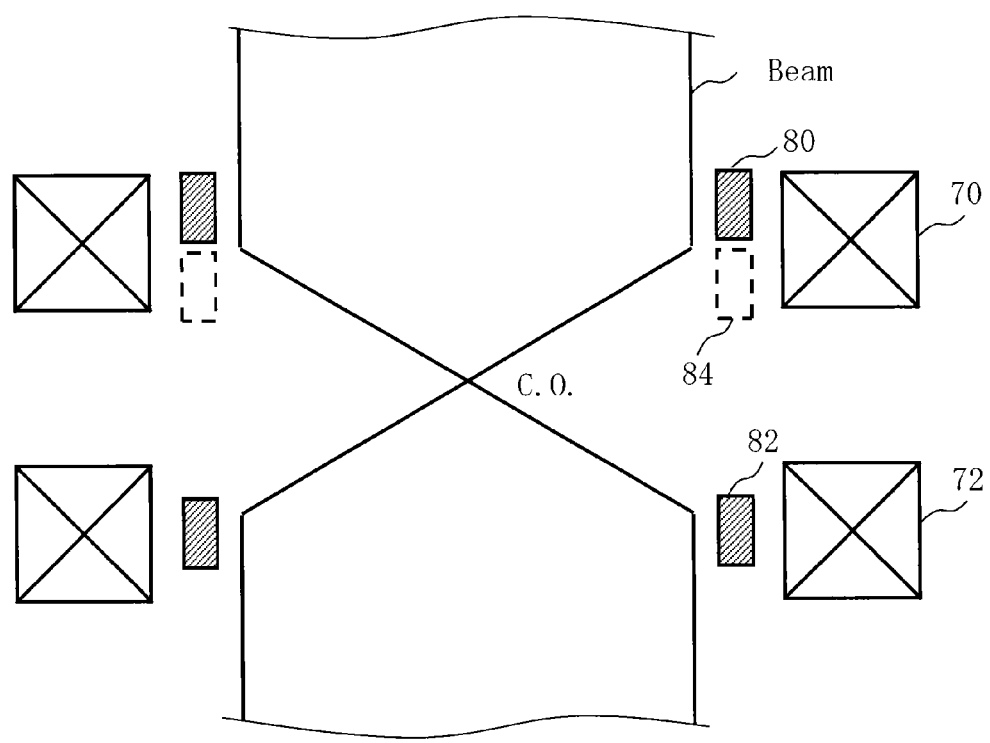
FIG. 15 shows an arrangement relation between an electromagnetic lens and an electrostatic lens.

FIG. 15 shows an arrangement relation between an electromagnetic lens and an electrostatic lens. In each embodiment described above, a group of the reducing lens 205 and the objective lens 207 is described as a group of electromagnetic lenses, but, it is not limited thereto. It is sufficient that there is a group of the electromagnetic lenses 70 and 72 which are arranged in the optical system where an electron beam passes, and directions of whose magnetic fields are opposite. Control similar to what is described above can be performed by arranging the three-stage electrostatic lenses 80, 82, and 84 such that two stages are arranged in one of the magnetic fields of the electromagnetic lenses 70 and 72, whose magnetic field directions are opposite, and one stage is in the other of the magnetic fields.

Embodiments have been explained referring to concrete examples described above. However, the present invention is not limited to these specific examples. The raster scanning operation described above is just an example. It is also acceptable to use other operation method instead of the raster scanning operation, using multiple beams. Moreover, the number of electrostatic lenses should just be three or more, and the number of the electrostatic lenses which also serves as a deflector should be one or more.

While the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other charged particle beam writing method and charged particle beam writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing apparatus comprising:
    a stage configured to mount a target object thereon;
    an emission unit configured to emit a charged particle beam;
    an aperture member, in which a plurality of openings are formed, configured to form a multibeam by letting a region including a whole of the plurality of openings be irradiated with the charged particle beam and letting portions of the charged particle beam respectively pass through a corresponding opening of the plurality of openings;
    a plurality of electromagnetic lenses, directions of whose magnetic fields are opposite; and
    three or more electrostatic lenses, at least one of which is arranged in each of the magnetic fields of the plurality of electromagnetic lenses and one or more of which also serve as deflectors for collectively deflecting the multibeam onto the target object,
    wherein the multibeam is deflected by a two-state deflection of main and sub stages, and two of the three or more electrostatic lenses serve as two main deflectors being the deflectors for performing a main stage deflection of the two-stage deflection,
    the apparatus further comprising a sub deflector for performing a sub stage deflection of the two-stage deflection, the sub deflector being provided to be arranged between the two main deflectors.

2. The apparatus according to claim 1, wherein one or more of the three or more electrostatic lenses, which include the one or more electrostatic lenses also serving deflectors, serve as stigmators.

3. The apparatus according to claim 1, wherein adjustment of the three or more electrostatic lenses is performed such that the multibeam is dynamically focused in accordance with a surface height of the target object, magnification of a beam image of the multibeam is maintained to be constant, and the beam image is not rotated at a same time, by using the three or more electrostatic lenses.

4. The apparatus according to claim 3, wherein the one or more of the three or more electrostatic lens, also serving as the deflectors, is separated into a plurality of electrodes along a circumferential direction and has a sufficient length to deflect the multibeam to the target object, and voltage corresponding to an amount of focus correction for dynamically focusing by the one or more of the three of more electrostatic lenses is equally applied to the plurality of electrodes.

5. The apparatus according to claim 1, wherein two of the three or more electrostatic lenses are respectively composed of ring-shaped three-stage electrodes.

6. The apparatus according to claim 1, wherein one of the three or more electrostatic lenses is composed of a ring-shaped electrode being a first stage, a plurality of electrodes separated along a circumferential direction being a second stage, and a ring-shaped electrode being a third stage.

7. The apparatus according to claim 6, wherein the one of the three or more electrostatic lenses also serves as one of the deflectors.

8. The apparatus according to claim 7, wherein the one of the three or more electrostatic lenses also serves as a stigmator.

9. The apparatus according to claim 1, wherein two of the three or more electrostatic lenses are arranged in one magnetic field of the plurality of electromagnetic lenses, and one of the three or more electrostatic lenses and the sub deflector are arranged in another magnetic field of the plurality of electromagnetic lenses.

* * * * *